United States Patent [19]

Ahlgren et al.

[11] Patent Number: 4,970,567

[45] Date of Patent: Nov. 13, 1990

[54] METHOD AND APPARATUS FOR DETECTING INFRARED RADIATION

[75] Inventors: William L. Ahlgren, Goleta; Eric F. Schulte, Santa Barbara, both of Calif.

[73] Assignee: Santa Barbara Research Center, Goleta, Calif.

[21] Appl. No.: 393,044

[22] Filed: Aug. 8, 1989

Related U.S. Application Data

[63] Continuation of Ser. No. 123,842, Nov. 23, 1987, abandoned.

[51] Int. Cl.$^5$ ............................................. H01L 27/14
[52] U.S. Cl. ......................................... 357/30; 357/24; 357/61
[58] Field of Search .................... 357/4, 16, 24, 30, 61

[56] References Cited

U.S. PATENT DOCUMENTS

| | | | |
|---|---|---|---|
| 3,760,240 | 9/1973 | Bergt | 357/30 |
| 3,789,276 | 1/1974 | Sivertsen | 357/30 |
| 3,980,915 | 9/1976 | Chapman et al. | 357/30 |
| 4,019,198 | 4/1977 | Endo et al. | 357/54 |
| 4,048,535 | 9/1977 | Cox et al. | 357/30 |
| 4,053,919 | 10/1977 | Andrews, II et al. | 357/30 |
| 4,286,278 | 8/1981 | Lorenze, Jr. et al. | 357/61 |
| 4,313,127 | 1/1982 | Su et al. | 357/30 |
| 4,521,798 | 6/1985 | Baker | 29/572 |
| 4,549,195 | 10/1985 | Bluzer | 357/30 |
| 4,553,152 | 11/1985 | Nishitani | 357/16 |
| 4,559,695 | 12/1985 | Baker | 357/30 |
| 4,608,586 | 8/1986 | Kim | 357/16 |
| 4,614,960 | 9/1986 | Bluzer | 357/24 |
| 4,630,090 | 12/1986 | Simmons et al. | 357/24 LR |
| 4,727,047 | 2/1988 | Bozler et al. | 357/4 |

FOREIGN PATENT DOCUMENTS 0137988  4/1985  European Pat. Off. .

OTHER PUBLICATIONS

Bluzer, N., and Stehlac, R., "Buffered Direct Injection of Photocurrents into Charge-Coupled Devices", *IEEE Transactions on Electron Devices*, ED 25, No. 2, p. 160, Feb. 1978.

Primary Examiner—Eugene R. LaRoche
Assistant Examiner—Michael B. Shingleton
Attorney, Agent, or Firm—W. C. Schubert; W. K. Denson-Low

[57] ABSTRACT

A method and apparatus for detecting infrared radiation is disclosed. The apparatus comprises a substrate (12) having readout and signal processing circuits (14) integrated therein. The substrate (12) is formed from a material selected from the group consisting of silicon, gallium arsenide, or germanium. A first semiconductor layer (28) is grown on the substrate (12) from a material selected from the group consisting of mercury-cadmium-telluride, mercury-zinc-telluride, mercury-cadmium-selenide, mercury-zinc-selenide, mercury-cadmium-sulfide, mercury-zinc-sulfide, lead-tin-telluride, lead-tin-selenide, lead-tin-sulfide, indium-arsenide-antimonide, gallium-indium-antimonide, or gallium-antimonide-arsenide. A second semiconductor layer (30) is then grown on the first semiconductor layer (28).

12 Claims, 1 Drawing Sheet

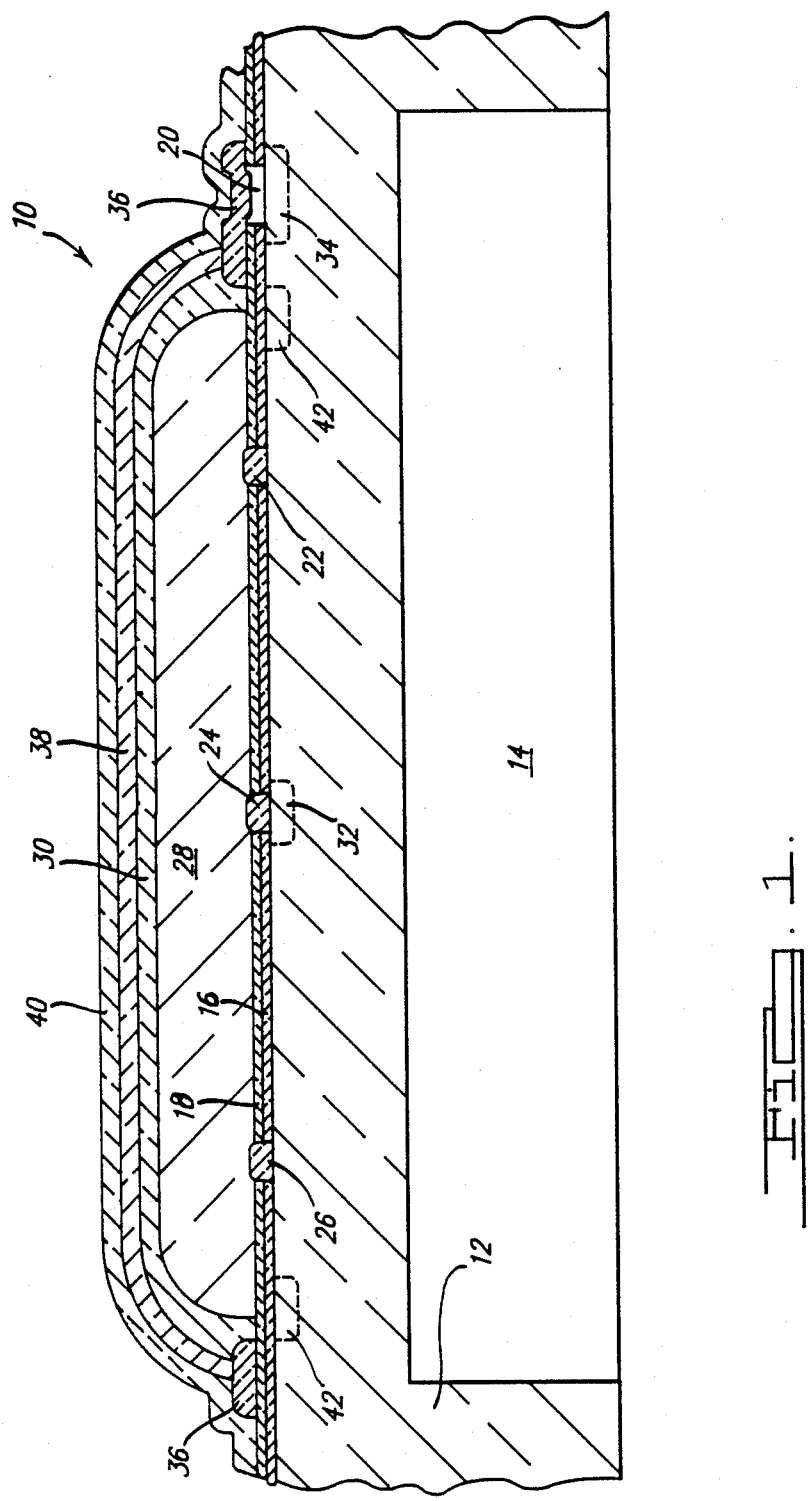

METHOD AND APPARATUS FOR DETECTING INFRARED RADIATION

This application is a continuation of application Ser. No. 123,842, filed Nov. 23, 1987, now abandoned.

BACKGROUND OF THE INVENTION

1. Field of the Invention

This invention relates to the field of infrared sensing, and more particularly concerns a method and apparatus for detecting infrared radiation.

2. Description of Related Art

Elemental infrared detectors are often used in surveillance, target seeking, and search and tracking imaging systems to sense the presence of electromagnetic radiation having wavelengths from 1-30 $\mu$m. To detect infrared radiation, these elemental detectors often use temperature sensitive pyroelectric and ferroelectric materials such as triglicine sulfate and lanthanum doped lead zirconate titanate crystals. Such crystals exhibit spontaneous electrical polarization in response to incident infrared radiation which creates a potential drop across electrodes attached to the crystals. Photoconductive materials such as lead-sulfide and mercury-cadmium-telluride may also be used in which the resistance of the material changes as a function of incident radiation. Finally, photovoltaic devices such as those fabricated from mercury-cadmium-telluride, indium antimonide, or similar materials may be used in which intrinsic band-to-band electron-hole excitation generates a current or voltage which is proportional to the incident radiation flux.

Arrays of such elemental detectors may be used to form thermal imaging systems. In real-time thermal imaging systems such as forward looking infrared ("FLIR") imaging sensors, oscillating prism mirrors are used to scan radiation emitted by a source across a one-dimensional array of elemental detectors. When the elemental detectors are used in this manner, the temporal outputs of the detectors may be used to generate a two-dimensional representation of the image. In two-dimensional detector array imaging systems which can utilize either staring or scanning arrays, the elemental detectors produce free charge carriers or currents which may be monitored by an appropriate readout integrated circuit such as a charge-coupled device ("CCD"). The output from the CCD can be processed by various techniques such as time delay and integration or parallel-to-serial scan conversion, with the choice depending on the system requirements of frame rate, signal-to-noise ratios, etc. Other readout devices may also be used.

While the detector structures described above are effective, they generally have several drawbacks in terms of fabrication. First, many of such detector structures are hybridized in which the detector and the readout device are separately fabricated and then mechanically bonded. Because the formation of hybridized structures involves additional processing steps, such structures tend to have lower yield during production when compared to monolithic devices (i.e., devices in which the detector and the readout and signal processing circuit are fabricated in one material system). In addition, there is a greater likelihood that defects while be unintentionally introduced during fabrication resulting in lower reliability and reduced performance. Monolithic detectors, while avoiding the additional processing steps required for hybridization, suffer from the necessity of using the same material as the infrared detector for the signal processing circuits. This material (e.g., HgCdTe or NnSb) invariably leads to lower performance signal processing circuits than circuits formed from silicon or gallium arsenide, for which the fabrication technology is well-developed.

SUMMARY OF THE INVENTION

According to the preferred embodiment of the present invention, a method and apparatus for detecting infrared radiation is disclosed. The apparatus comprises a substrate having readout and signal processing circuits integrated therein. The substrate is formed from material selected from the group consisting of silicon, gallium arsenide, and germanium. A first semiconductor layer is grown on the substrate from a material selected from the group consisting of mercury-cadmium-telluride, mercury-zinc-telluride, mercury-cadmium-selenide, mercury-zinc-selenide, mercury-cadmium-sulfide, mercury-zinc-sulfide, lead-tin-telluride, lead-tin-selenide, lead-tin-sulfide, indium-arsenide-antimonide, gallium-indium-antimonide, or gallium-antimonide-arsenide. A second semiconductor layer is then formed on the first semiconductor layer.

BRIEF DESCRIPTION OF THE DRAWINGS

The various advantages of the present invention will become apparent to one skilled in the art upon reading the following specification and by reference to the following drawing in which:

The FIGURE is a cross-sectional view of the preferred embodiment of the apparatus for detecting infrared radiation according to the present invention.

DESCRIPTION OF THE PREFERRED EMBODIMENT

According to the preferred embodiment of the present invention, a structure 10 for detecting infrared radiation is provided as shown in the FIGURE. The structure 10 may be used as a single detection element, or be part of a multiple-element imaging device. The structure 10 comprises a substrate 12 which may be made of silicon, gallium arsenide, or germanium, though it is to be understood that other suitable materials may be used. The substrate 12 comprises suitable readout and signal processing circuits, generally designated by the numeral 14, for converting the output of the semiconductor layers described below into useable form. The readout and signal processing circuits 14 may be similar to that disclosed in Bluzer, N., and Stehlac, R., "Buffered Direct Injection of Photocurrents into Charge-Coupled Devices", *IEEE Transactions on Electron Devices*, ED 25, n.2p. 160 Feb. 1978, which is hereby incorporated by reference. It should be understood that other suitable means for processing the output from the semiconductor layers may be used.

To control the electrical properties of the surface of the substrate, a first passivation layer 16 is provided. The first passivation layer 16 is selected from materials which provide optimum passivation for the substrate 12. Such materials may include $SiO_2$ or $SiN_4$, though it is to be understood that other suitable materials may be used. A second passivation layer 18 is deposited on the first passivation layer 16. The second passivation layer 18 is formed of one of several materials which provide optimum passivation for the infrared-active semiconductor layers described below and forms a surface on which nucleation of the infrared-active semiconductor layers does not occur. Such materials may include $SiO_2$ or ZnS, though it is to be understood that other suitable materials may be used. The first and second passivation layers 16 and 18 have a ohmic contact 20 and a plurality of nucleation windows 22-26. The ohmic contact 20 is used for providing electrical communication between the second semiconductor layer described below and the readout and signal processing circuits 14. The nucleation windows 22-26 are used for providing seed locations for nucleation of the first semiconductor layer. In addition, the nucleation window 24 allows electrical communication between the first semiconductor layer and the readout and signal processing circuit 14.

To generate a photocurrent in response to incident radiation, the structure 10 further comprises a first semiconductor layer 28 and a second semiconductor layer 30. The first and second semiconductor layers 28 and 30 together comprise the base and collector layers of a heterojunction photodiode. The first semiconductor layer 28 comprises a layer of mercury-cadmium-telluride having a stoichiometric relationship defined by $Hg_{1-x}Cd_xTe$. The composition value of x is chosen so that the first semiconductor layer 28 is sensitive to infrared radiation of a particular wavelength in the infrared spectrum. For example, if the composition value of x is chosen to be approximately 0.2, the first semiconductor layer 28 will be sensitive to long wavelength infrared radiation having a cut-off wavelength of approximately 10-12 m at the desired operating temperature (e.g., 77 Kelvin). It is to be understood, however, that the first semiconductor layer 28 may comprise other suitable materials such as mercury-zinc-telluride, mercury-cadminum-selenide, mercury-zinc-selenide, mercury-cadmium-sulfide, mercury-zinc-sulfide, lead-tin-telluride, lead-tin-selenide, lead-tin-sulfide, indium-arsenide-antimonide, gallium-indium-antimonide, or gallium-antimonide-arsenide.

The second semiconductor layer 30 comprises a layer of mercury-cadmium-telluride having a stoichiometric relationship defined by $Hg_{1-y}Cd_yTe$. The composition value of y may be chosen to be larger than the composition value x of the first semiconductor layer 28, and may typically have a value of 0.3 . It is it be understood, however, that other suitable values of y may be chosen and other suitable materials may also be chosen including mercury-cadmium-telluride, mercury-zinc-telluride, mercury-cadmium-selenide, mercury-zinc-selenide, mercury-cadmium-sulfide, mercury-zinc-sulfide, lead-tin-telluride, lead-tin-selenide, lead-tin-sulfide, indium-arsenide-antimonide, gallium-indium-antimonide, or gallium-antimonide-arsenide.

The first semiconductor layer 28 acts as a photodiode base layer while the second semiconductor layer 30 acts as a photodiode collector layer. To increase the collection efficiency of the structure 10, however, the roles of the first and second semiconductor layers 28 and 30 may be reversed (i.e., the second semiconductor layer 30 becoming the base layer and the first semiconductor layer 28 the collector layer). In this case, the composition value of y will be approximately 0.2 and the composition value of x will be approximately 0.3. More generally, however, the second semiconductor layer 30 will become the narrow bandgap material and the first semiconductor layer 28 will become the wide bandgap material. The layers 28 and 30 are doped to have impurities to opposite type, i.e., the first semiconductor layer 28 being doped p-type and the second semiconductor layer 30 being doped n-type, or vice-versa. It will be appreicated, however, that isotype heterojunctions may also be employed.

When a photon of light in the infrared spectrum of interest is absorbed by the apparatus structure 10, an electron/hole pair is generated. If the electron-hole pair arrives at the junction between the first and second semiconductor layers 28 and 30 before recombining, the electric field at the junction between the first and second semiconductor layers 28 and 30 will cause the electron to move into the n-type semiconductor layer and the hole to move into the p-type semiconductor layer. This electron/hole migration produces a photocurrent which is proportional to the number of photons received.

To sense the photocurrent generated in the first and second semiconductor layers 28 and 30, the substrate 12 further comprises the heavily doped regions 32 and 34. The heavily doped region 32 allows electrical communication between the readout and signal processing circuits 14 and the first semiconductor layer 28 through the nucleation window 24. The material deposited in the nucleation window 24 can be HgTe or a similar semi-metallic material with crystal structure and lattice constant similar to the semiconductor layer 28 (thus, HgSe, HgS, PbTe, PbSe, PbS, and grey Sn could be alternative choices). This will provide a better ohmic contact between the heavily doped region 32 and the first semiconductor layer 28. The same material is simultaneously deposited in nucleation windows 22 and 26, but there it serves only as a nucleation site for first semiconductor layer 28, not as an ohmic contact. In addition, the heavily doped region 34 allows electrical communication between the readout and the signal processing circuits 14 and the second semiconductor layer 30 through a metallization layer 36 and the ohmic contact 20. The ohmic contact 20 and 36 can be two different metals, the ohmic contact 20 chosen to make good ohmic contact with the heavily doped region 34, and the metallization layer 36 chosen to make good ohmic contact with the second semiconductor layer 30, such as platinum for n-type and gold for p-type. The metallization layer 36 must also be chosen to be a material on which nucleation of first semiconductor layer 28 is suppressed.

When the second semiconductor layer 30 acts as the base of the photodiode, the free charge carriers in the interior of the second semiconductor layer 30 drift toward the interface with second semiconductor layer 28 and recombine. The result of this recombination is to reduce the efficiency with which free charge carriers are collected by the first passivation layer 16. To reduce the recombination velocity of the free charge carriers in the second semiconductor layer 30 when the second semiconductor layer 30 acts as the base of the photoiode, a third semiconductor layer 38 is provided. The third semiconductor layer 38 may be fabricated from mercury-cadmium-telluride having a stoichiometric relationship defined by $Hg_{1-z}Cd_zTe$, in which the composition value z is chosen to be greater than y. It is to be understood, however, that other suitable materials may be used such as mercury-cadmium-telluride, mercury-zinc-telluride, mercury-cadmium-selenide, mercury-zinc-selenide, mercury-cadmium-sulfide, mercury-zinc-sulfide, lead-tin-telluride, lead-tin-selenide, lead-tin-sulfide, indium-arsenide-antimonide, gallium-indium-antimonide, or gallium-antimonide-arsenide.

The structure 10 further includes an anti-reflection coating 40. The anti-relection coating 40 is located on the third semiconductor layer 38 and is used to reduce the reflection of incident infrared radiation. The anti-reflection coating 40 is manufactured from a material which has an index of refraction between that of air and the third semiconductor layer 38. While the anti-relfection coating 40 may be fabricated from zinc sulfide, zinc selenide, or zinc telluride, other suitable materials may be used. The structure 10 also comprises the field plate regions 42 which are used to control the relative potential of the first and second semiconductor layers 28 and 30 as well as the first passivation layer 16. The field plates 42 are located below the region where the first and second semiconductor layers 28 and 30 intersect the first passivation layer 16. The field plate regions 42 may either be doped regions in the substrate 12 or metal deposited on the surface of the substrate 12.

Control of electrical potential in the region where layers 28, 30 and 16 intersect is essential to device performance. To control the electric potential in this region, the first passivation layer 16 is chosen to provide stable surface potentials, near the flat bank potential, in the first and second semiconductor layers 28 and 30 (i.e., the first passivation layer 16 is chosen to passivate the first and second semiconductor layers 28 and 30) and by using the field plate regions 42 to compensate for any deviation from the flat band condition by the use of an applied potential, in the same way as gates are used to optimize photodiode performance in current practice.

The growth of the first and second semiconductor layers 28 and 30 over the first passivation layer 16 provides automatically a self-passivated buried junction. The existence of field plate region 42 permits optimization of surface potential in the junction region by gate-voltage control.

By providing a structure as described above, the performance of the structure 10 may be optimized both from the signal processing viewpoint as well as from that of infrared detection. The substrate 12 may be silicon, gallium arsenide, or germanium from which signal processing circuits of optimum performance can be fabricated. The first and second semiconductor layers 28 and 30 which are chosen from a material which optimizes infrared detection are then deposited on the substrate by heteroepitaxial selected area deposition. The combination of this detector structure and the substrate 12 thus constitute a monolithic heteroepitaxial focal plane array, and does not suffer from the disadvantages assocated with hybridized structures.

The structure 10 may be fabricated in the manner described below. Once the substrate 12 has been formed with the readout and signal processing circuit 14, the heavily doped regions 32 and 34 as well as the field plate regions 42 are formed. The passivation layers 16 and 18 are then deposited on the substrate 12. A contact window is then opened by photolithography in the passivation layers 16 and 18 over the heavily doped region 34. A first layer of metal is applied by vacuum deposition and lift-off so as to form the ohmic contact 20 for the heavily doped region 34. A second photolithographic step is then performed to form the metallization layer 36. The shape of the metallization layer 36 is chosen to form the boundary of the structure 10 and is selected to make ohmic contact with the second semiconductor layer 30.

A third photolithographic step is then used to open the nucleation windows 22-26 in the passivation layers 16 and 18. The shape, size and spacing of the nucleation windows 22-26 are to be determined by the desired detector geometry and characteristics of the epitaxial growth process used. For example, if the lateral growth from the nucleation window occurs at the same rate as the vertical growth, then the windows should be spaced as far apart as they are wide. The number of nucleation windows should also be minimized as an excessive number of nucleation windows may place spacial constraints on the readout and signal processing circuits 14 in the substrate 12. The number and size of the nucleation windows 22-26 can be minimized by maximizing the ratio of the lateral growth rate to the vertical growth rate of the first semiconductor layer 28. In addition, the ratio of the lateral growth rate to the vertical growth rate of the second semiconductor layer 30 should also be maximized so as to provide the largest possible distance between the junction between the first and second semiconductor layers 28 and 30 and the metallization layer 36. By making the first semiconductor layer 28 a thick layer, the number of nucleation windows 22-26 required is reduced. Making the second semiconductor layer 30 thicker allows more tolerance for lateral growth rate variation since the distance between the metallization layer 36 and the junction between the first and second semiconductor layers 28 and 30 become larger.

After opening the nuleation windows 22-26 in the passivation layers 28 and 30, the remaining photoresist is removed from the passivation layer 16 and the substrate 12 is placed in a low-temperature metallorganic vapor phase epitaxial reactor so that in-situ clean-up of the surface of the substrate 12 can be performed. The in-situ surface clean-up may involve ultraviolet ozone etching, atomic hydrogen etching, or etching by other free radicals generated from suitable reactant sources in an ultraviolet or plasma field.

Nucleation crystals are then grown in the nucleation windows 22-26 of the passivation layers 16 and 18. Because the material from which the passivation layer 18 and the metalliation layer 36 are formed resist the formation of nucleation crystals, the nucleation crystals only form in the nucleation windows 22-26. Reactant flow into the metallorganic vapor phase epitaxial reactor is then changed to grow the first semiconductor layer 28 which nucleates on the nucleation crystals in the nucleation windows 22-26. The reactant flow is then further changed to grow the second semiconductor layer 30. A final change in the reactant flow permits the growth of the third semiconductor layer 38. Finally, the anti-reflection layer 40 is formed on the third semiconductor layer 38 by vacuum evaporation outside the metallorganic vapor phase reactor.

It will therefore be seen that the present invention is able to provide an apparatus for detecting infrared radiation in which the infrared material can be selected to optimize infrared detection, while the signal-processing material may be selected to optimize the signal processing circuits. The present invention should therefore not be judged in accordance with this specific example presented herein. For example, other suitable area selective epitaxial growth techniques may be used for forming the first semiconductor layer. The relative doping of the first and second semiconductor layers may also change, as well as the function which they perform (i.e., base or collector). Othr modifications will become apparent to the skilled practitioner upon a study of the specification, drawings and following claims.

What is claimed is:

1. A monolithic structure for detecting infrared radiation comprising:
   a substrate having readout and signal processing circuits integrated therein, said substrate formed from a material selected from the group consisting of silicon, gallium arsenide, and germanium;
   a first semiconductor layer grown on said substrate which has said readout and signal processing circuits integrated therein, said first layer of simiconductor material formed from a material selected from the group consisting of mercury-cadmium-telluride, mercury-zinc-telluride, mercury-cadmium-selenide, mercury-zinc-selenide, mercury-cadmium-sulfide, mercury-zince-sulfide, lead-tin-telluride, lead-tin-selenide, lead-tin-sulfide, indium-arsenide-antimonide, gallium-indium-antimonide, and gallium-antimonide-arsenide, said first semiconductor layer disposed directly over and displaced from at least a portion of said readout and signal processing electronics;
   a first passivation layer disposed between said substrate and said first semiconductor layer;
   A plurality of nucleation windows disposed on said first passivation layer operable to control the formation of said first semiconductor layer, at least one of said nucleation windows permitting electrical communication between said first semiconductor layer and said readout and signal processing circuits;
   a plurality of nucleation crystals formed in said nucleation windows, said nucleation crystals formed from a material selected from the group consisting of mercury-cadmiun-telluride, mercury-zinc-telluride, mercury-cadmium-selenide, mercury-zinc-selenide, mercury-cadmium-sulfide, mercury-zinc-sulfide, lead-tin-telluride, lead-tin-selenide, lead-tin-sulfide, indium-arsenide-antimonide, gallium-indium-antimonide, or gallium-antimonide-arsenide; and
   a second semiconductor layer grown on said first semiconductor layer, said first and second semiconductor layers operable to deliver an electrical signal to said readout and signal processing circuits in said substrate in response to the infrared radiation received by said first and second semiconductor layers.

2. The apparatus of claim 1, further comprising a second pasivation layer disposed between said first passivation layer and said first semiconductor layer.

3. The apparatus of claim 2, wherein nucleation of said first semiconductor layer occurs only in said nucleation windows.

4. The apparatus of claim 1, further comprising a third semiconductor layer disposed on said second semiconductor layer, said third semiconductor layer operable to reduce the surface recombination velocity of the free charge carriers in said second semiconductor layer.

5. The apparatus of claim 4, further comprising a layer of anti-reflection material disposed on said third semiconductor layer.

6. A method for detecting infrared radiation comprising:
   forming first and second layers of semiconductor material by growing nucleation crystals using metallorganic vapor phase epitaxy in nucleation windows of a first passivation layer which is disposed on a substrate, said nucleation cyrstals being formed from the same material as said first layer of semiconductor material;
   exposing said first layer and said second layer of semiconductor material to a source of infrared radiation, said first and second semiconductor layers being formed from a material selected from the group consisting of mercury-cadmium-telluride, mercury-zinc-telluride, mercury-cadmium-selenide, mercury-zinc-selenide, mercury-cadmium-sulfide, mercury-zinc-sulfide, lead-tin-telluride, lead-tin-selenide, lead-tin-sulfide;
   generating a photocurrent in said first and second layers of semiconductor material;
   sensing said photocurrent by readout and signal processing circuits disposed within said substrate upon which said first and second semiconductor layers are grown, said first semiconductor layer disposed directly over and displaced from at least a portion of said readout and signal processing electronics, said substrate being formed of a material selected from the group consisting of silicon, gallium arsenide, or germanium; and
   causing electrical communication between said first semiconductor layer and said readout and signal processing circuits through at least one of said nucleation windows.

7. The method of claim 6, wherein said first layer of semiconductor material, said second layer of semiconductor material and said substrate comprise a monolithic structure.

8. The method of claim 6, wherein said first passivation layer is separated from said first layer of semiconductor material by a second passivation layer.

9. The method of claim 6, comprising the additional step of reducing the surface recombination velocity of free charge carriers in said second layer of semiconductor material by free charge carriers in said second layer of semiconductor material by disposing a third layer of semiconductor material on said second layer of semiconductor material.

10. The method of claim 6, further comprising the additional step of allowing infrared radiation to pass through a layer of anti-reflection material.

11. An array of monolithic structures for detecting infrared radiation, each of said monolithic structures comprising:
   a substrate having readout and signal processing circuits integrated therein, said substrate formed from a material selected to optimize performance of said readout and signal processing circuits;
   a first semiconductor layer grown on said substrate which has said readout and signal processing circuits integrated therein, said first layer of semiconductor material formed from a material selected to optimize infrared detection, said first semiconductor layer disposed directly over and displaced from at least a portion of said readout and signal processing electronics;
   a plurality of passivation layers disposed between said substrate and said first layer of semiconductor material;
   a plurality of nucleation windows within said plurality of passivation layers, said plurality of nucleation windows operable to control the formation of said first semiconductor layers, at least one of said nucleation windows permitting electrical communication between said first semiconductor layer and said readout and signal processing circuits;

a plurality of nucleation crystals formed in said nucleation windows, said necleation crystals formed from the same material as said first semiconductor layer;

a second semiconductor layer disposed on said first semiconductor layer operable to deliver an electrical signal to said readout and signal processing circuits in said substrate in response to the infrared radiation received by said first and second semiconductor layers;

a third semiconductor layer disposed on said second semiconductor layer operable to reduce the surface recombination velocity of the free charge carriers in said second semiconductor layer; and an anti-reflection coating disposed on the third semiconductor layer, said anti-reflection coating having an index of refraction between that of air and the third semiconductor layer.

12. The array of claim 11, wherein said monolithic structure further comprises an ohmic contact permitting electrical communication between said first and second semiconductor layers and said read out and signal processing circuits.

* * * * *